United States Patent [19]

Takayanagi et al.

[11] Patent Number: 4,470,009
[45] Date of Patent: Sep. 4, 1984

[54] SURFACE POTENTIOMETER

[75] Inventors: Yoshiaki Takayanagi, Kawasaki; Koji Suzuki, Yokohama; Nao Nagashima, Tokyo; Hiroshi Ogawa; Kouki Kuroda, both of Yokohama; Joyji Nagahira, Tokyo, all of Japan

[73] Assignee: Canon Kabushiki Kaisha, Tokyo, Japan

[21] Appl. No.: 219,483

[22] Filed: Dec. 23, 1980

[30] Foreign Application Priority Data

Dec. 28, 1979 [JP] Japan .................. 54-172766
Dec. 28, 1979 [JP] Japan .................. 54-172768
Dec. 28, 1979 [JP] Japan .................. 54-172769
Dec. 28, 1979 [JP] Japan .................. 54-172770
Dec. 28, 1979 [JP] Japan .................. 54-172771

[51] Int. Cl.³ .................................. G01N 31/02
[52] U.S. Cl. .................................. 324/72; 324/457; 324/458

[58] Field of Search .............. 324/457, 458, 452, 455, 324/158 P, 72, 72.5; 355/14 CH, 14 R

[56] References Cited

U.S. PATENT DOCUMENTS 4,267,511  5/1981  Suzuki ......................... 324/458
4,318,042  3/1982  Eda ............................. 324/457

Primary Examiner—Michael J. Tokar
Attorney, Agent, or Firm—Fitzpatrick, Cella, Harper & Scinto

[57] ABSTRACT

A surface potentiometer comprises a measuring electrode, a chopper for intermittently shielding the electric field between the measuring electrode and an object to be measured, a preamplifier circuit for converting an AC signal induced in the measuring electrode into a low impedance signal, and a printed substrate having the wiring pattern of the preamplifier circuit formed on one surface thereof and the electrode pattern of the measuring electrode formed on the other surface thereof.

9 Claims, 30 Drawing Figures

4,470,009

SURFACE POTENTIOMETER

BACKGROUND OF THE INVENTION

1. Field of the Invention

This invention relates to a surface potentiometer for measuring the surface potential of an object to be measured, and more particularly to a surface potentiometer for measuring the surface potential of a recording medium such as a photosensitive medium in an electrostatic recording apparatus such as an electrophotographic copying machine or the like.

2. Description of the Prior Art

Among such surface potentiometers, there is one type in which, as already disclosed in Applicant's U.S. Pat. No. 4,261,660, issued on Apr. 14, 1982 a cylindrical chopper having a small hole in the cylinder portion thereof is fixed as one shield means to the output shaft of a compact DC motor and rotated. In the surface potentiometer using such cylindrical chopper, by intermittently shielding the small hole of the cylindrical chopper between the measured surface of a measured portion and a measuring electrode disposed at opposed positions, an AC voltage having an amplitude proportional to the differential voltage between the measured surface and the electrode is induced on the electrode.

However, such a conventional surface potentiometer requires a motor of high accuracy in order to obtain a stable AC signal of high frequency and this has been a cause of high cost. Also, in the conventional surface potentiometer, when the voltage applied to the motor fluctuates, the frequency of the AC signal put out fluctuates and therefore, such a special contrivance has been necessary that the fluctuation of the voltage applied to the motor is small for the fluctuation of the power source voltage. Further, the use of the motor has caused the size of the potentiometer to be limited by the motor and a difficulty has been encountered in making the potentiometer compact.

SUMMARY OF THE INVENTION

It is an object of the present invention to eliminate the above-noted disadvantages peculiar to the prior art and to provide a compact surface potentiometer of low cost.

It is another object of the present invention to provide a surface potentiometer in which the insulation of a circuit constituting the potentiometer is enhanced.

Other objects of the present invention will become apparent from the following detailed description taken in conjunction with the accompanying drawings.

DESCRIPTION OF THE PREFERRED EMBODIMENTS

Figure 1:
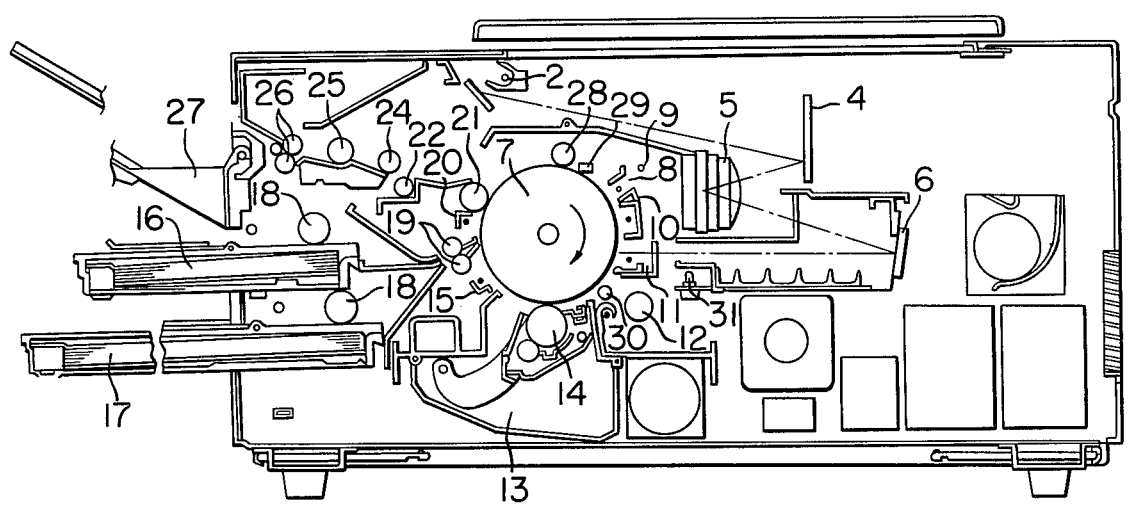
FIG. 1 is a cross-sectional view of an electrophotographic copying apparatus to which the surface potentiometer of the present invention is applicable.

By reference to FIG. 1 which is a cross-sectional view of a copying apparatus to which the surface potentiometer according to the present invention is applied, the outline of the copying process will be described. An original is placed on a fixed original carriage 1 which provides an original supporting surface. This original is illuminated by an illumination lamp 2 and is optically scanned by a first mirror 3 moved with the lamp 2 and a second mirror 4 moved at ½ of the velocity of the first mirror 3 in the same direction as the first mirror, and the image of the original is formed on a drum 7 clockwisely rotated as viewed in FIG. 1 by a fixed in-mirror lens 5 and a fixed mirror 6. The surface of the drum 7 is an electrophotographic photosensitive surface comprising an electrically grounded conductive layer, a photoconductive layer and a surface insulating layer, and a well-known method of forming a latent image on this surface may be adopted. For example, the residual charge on the surface of the drum 7 is uniformly removed by a precharger 8 and a pre-exposure lamp 9, whereafter the surface of the drum is uniformly charged by a primary charger 10. When the drum is rotated and reaches an imaging station, the drum surface is exposed to the image of the original while, at the same time, it is discharged by a discharger 11 and subsequently, the whole surface of the drum is exposed to the light from a whole surface exposure lamp 12, whereby an electrostatic latent image is formed on the surface of the drum 7. Subsequently, the electrostatic latent image on the drum surface is developed into a visible image by a developing roller 14 provided in a developing device 13 using liquid developer.

The latent image on the drum is usually developed into a visible image by toner contained in the developer, and there is provided a post-charger 15 for imparting a weak corona discharge to the drum surface and charging the drum surface to increase the force with which the toner adheres to the drum surface. Copy paper in a paper supply cassette 16 or 17 is fed by a paper feed roller 18 and transported toward the drum 7 while being timed by register rollers 19 so that the leading end edge of the copy paper is coincident with the leading end edge of the visible image on the drum 7. The toner image on the drum 7 is transferred onto the copy paper by a transfer charger 20. The copy paper with the toner image transferred thereonto is separated from the drum 7 by a separating roller 21, and is conveyed between a hot plate 23 and keep rollers 24, 25 by a conveyor roller 22, and the transferred image on the copy paper is heated and fixed, whereafter the copy paper is discharged into a tray 27 by discharge rollers 26.

On the other hand, the surface of the drum 7 is precleaned by a cleaning roller 28 urged against the drum surface and rotated in a direction opposite to the direction of rotation of the drum, and then is completely cleaned by a cleaning blade 29, thus becoming ready for another cycle of copying process.

Now, in the copying apparatus as shown in FIG. 1, for the sensitivity shift of the photosensitive medium resulting from a temperature change, a humidity change or a change with time, it is desirable to add surface potential control means and set the surface potential of the photosensitive medium always in a predetermined range. For this purpose, in the example of FIG. 1, a surface potentiometer 30 as means for measuring the surface potential of the photosensitive medium is mounted between the whole surface exposure lamp 12 and the developing device 13. As the surface potential control means and device, use may be made of the one already disclosed in detail in Applicant's U.S. continuation application Ser. No. 369,676, filed on Apr. 19, 1982, and therefore, it will herein be described only briefly.

This control system is one which measures the surface potential of the drum 7 by the surface potentiometer 30 during the pre-rotation of the drum, feeds it back and corrects it to thereby obtain in a predetermined range the surface potential of the drum when exposed to the image of the original. The pre-rotation of the drum refers to a predetermined number of rotations of the drum effected before the original is scanned and the image thereof is projected upon the photosensitive medium to obtain a predetermined number of copies from the original, and after this pre-rotation has been terminated, the original is scanned a predetermined number of times and the photosensitive medium is exposed to the image thereof, whereby a predetermined number of copies are obtained.

Figure 2:
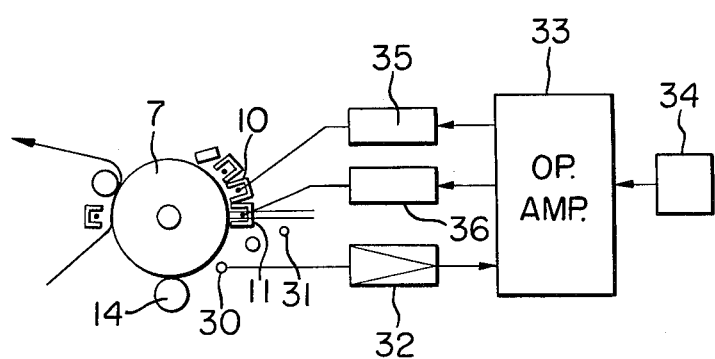
FIG. 2 is a block diagram of the surface potential control of a drum.

In FIG. 2, the light portion potential and dark portion potential of the drum surface are alternately measured by the surface potentiometer 30 by causing a reference current to flow to the primary charger 10 and the discharger 11 during the pre-rotation of the drum 7. When the light portion potential is measured, a blank exposure lamp 31 is turned on, and when the dark portion potential is measured, the blank exposure lamp 31 is turned off. The signals of the light portion and dark portion potentials detected by the surface potentiometer 30 are amplified by an amplifier circuit 32 and applied as input to an operational amplifier circuit 33.

In the operational amplifier circuit 33, a preset target potential constant 34 and said signals detected by the potentiometer 30 are compared to detect the difference therebetween, and correction current calculated in accordance with a preset correction formula is added to the reference current, and this added current is applied to the primary charger 10 and the discharger 11 through a primary high voltage power source 35 and a discharger power source 36, respectively.

Of the reference current plus the correction current, a current corresponding to the dark portion potential is applied to the primary charger and a current corresponding to the light portion potential is applied to the discharger. The reference current plus the correction current provides the reference current during the next control, namely, during the next pre-rotation of the drum. After the above-described control has been repeated during said pre-rotation of the drum, the surface potential of the drum 7 finally comes into a predetermined range. After such condition has been reached, the scanning of the original is effected and the projection of the original image onto the photosensitive medium is started.

Thus, even if a sensitivity shift of the photosensitive medium occurs, the light portion potential of the latent image for the same original and the dark portion potential of the latent image for the same orignal come into their respective predetermined standard ranges to thereby ensure good copy images.

Figure 3:
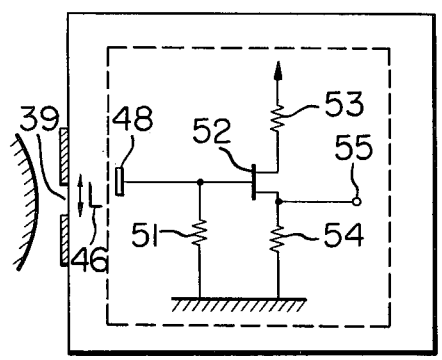
FIG. 3 is a diagram of a preamplifier circuit.
Figure 4:
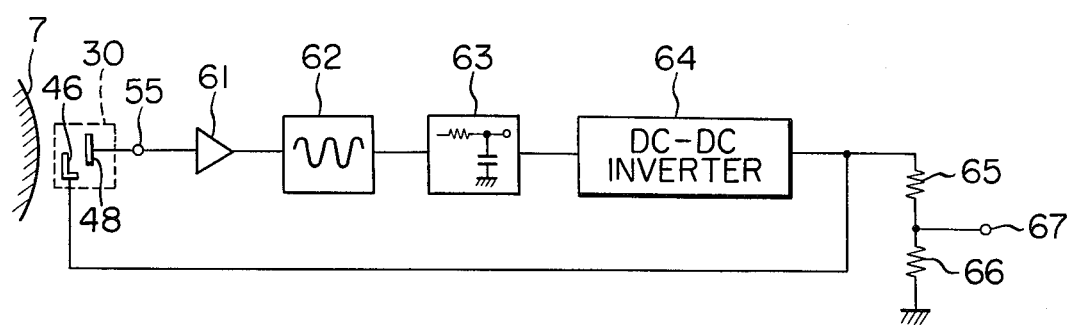
FIG. 4 is a diagram of a negative feedback control type potential detecting circuit.
Figure 7:
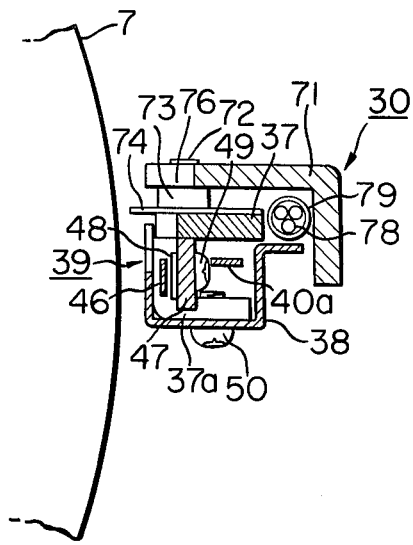
FIG. 7 is a cross-sectional view taken along line A—A of FIG. 5.
Figure 8:
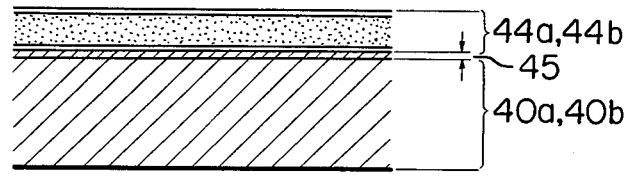
FIG. 8 is a partial enlarged cross-sectional view of a vibratory piece.

A specific embodiment of the surface potentiometer of the present invention will hereinafter be described. FIG. 3 diagrammatically shows the preamplifier circuit of the surface potentiometer 30. It includes a potential measuring window 39, a chopper electrode 46, a measuring electrode 48, a detection resistor 51, an impedance changing FET 52, resistors 53, 54, and an output terminal 55. By the chopper electrode 46 intermittently shielding the electric field between the drum which is the subject of measurement and the measuring electrode 48, an AC signal coincident with the number of vibrations of the chopper electrode 46 is induced with respect to the measuring electrode 48 and this AC signal is impedance-changed by the FET 52 and taken out at the output terminal 55. The detection signal induced at the output terminal 55 is processed in FIG. 4. In FIG. 4, reference numeral 61 designates a signal amplifier, reference numeral 62 denotes a DC regeneration clamp circuit, reference numeral 63 designates an integrating circuit, reference numeral 64 denotes a DC-DC inverter, reference numerals 65 and 66 denote resistors, and reference numeral 67 designates a detection output terminal. The detection signal induced at the output terminal 55 is amplified by the signal amplifier 61, and the amplified signal is applied as input to the integrating circuit 63 through the clamp circuit 62 and DC-regenerated. The DC-regenerated signal is DC-amplified by the variable type DC-DC inverter 64. The output voltage of the DC-DC inverter 64 is fed back to the chopper electrode 46, a base 37 and shield members 38, 74 (FIG. 7). Accordingly, as a whole, the circuit constitutes a negative feedback circuit and the same voltage as the surface potential on the drum 7 is fed back to the chopper electrode 46. Also, the output of the DC-DC inverter 64 is divided by the resistors 65, 66 and taken out as the detection voltage at the terminal 67.

On the other hand, the surface potentiometer 30 is of a construction as shown in FIGS. 5-8. That is, the surface potentiometer 30 is covered with a metal base 37 and a metal shield member 38 to protect the whole thereof against the influence of the extraneous electric field. In the shield member 38, a measuring window 39 for potential measurement is formed at a position opposed to the measured portion of the drum 7, and the potential of the photosensitive medium is measured through this measuring window 39.

Figure 6:
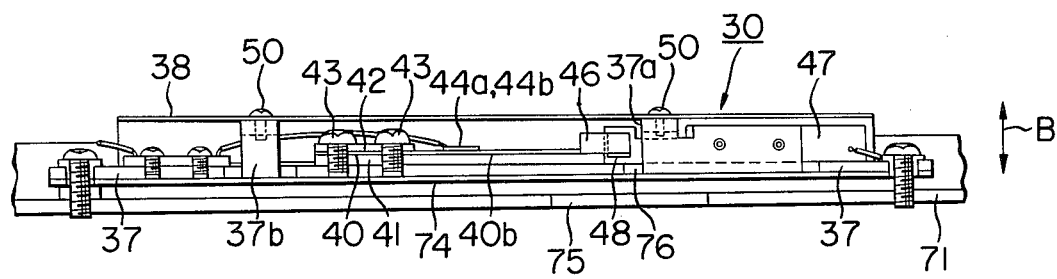
FIG. 6 is a front view of the surface potentiometer of FIG. 5.

Also, in the base 37, a tuning fork 40 is mounted on a metal spacer 41. The tuning fork 40 has a stiffening plate 42 placed thereon and is fixed by two screws 43 as shown in FIG. 6. The stiffening plate 42 is also made of a metal so as not to impart the influence of a suspended electric field to the chopper electrode which will later be described. The tuning fork 40 is formed of a metal spring material such as, for example, a phosphor bronze plate, and accordingly, the stiffening plate 42 and the tuning fork 40 are in a conductive state with the base 37 through the metal spacer 41.

Figure 5:
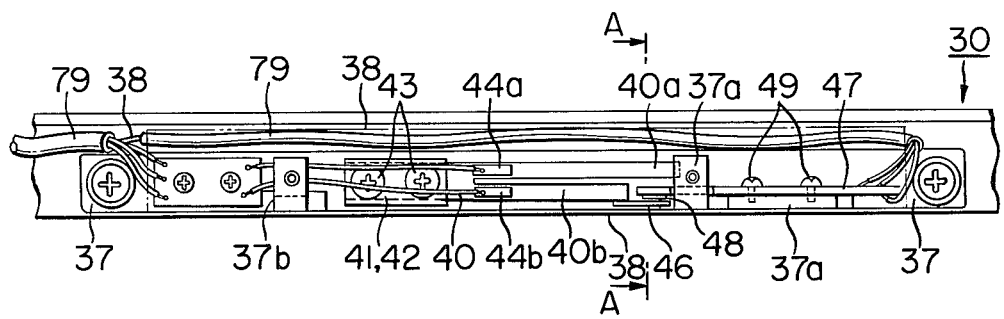
FIG. 5 is a plan view of the surface potentiometer according to a first embodiment.

As is apparent from FIG. 5, the tuning fork 40 comprises two vibratory pieces 40a and 40b and, as shown in FIG. 5, piezoelectric elements 44a and 44b are secured to the fulcrum sides of the respective vibratory pieces at lengthwise opposed positions of the vibratory pieces by means of electrically conductive adhesive agent.

The piezoelectric elements 44a and 44b are ones which produce a distortion in the direction of their surface when a voltage is applied in the direction of their thickness and, as shown in FIG. 6, they are secured to the vibratory pieces 40a and 40b of the tuning fork by means of electrically conductive adhesive agent 45 and form a unimorphous vibratory with the vibratory pieces and the shape of each piezoelectric element is elongated along the lengthwise direction of the vibratory piece and therefore, the distortion of the piezoelectric elements causes lengthwise distortion of the vibratory pieces 40a and 40b, which thus produce vibration in the direction of arrow B indicated in FIG. 6.

The end of one vibratory piece 40b of the tuning fork 40 constitutes a chopper electrode 46 as shield means. On the outer side of this chopper electrode 46, the measuring window 39 of the aforementioned shield member 38 is disposed at a position opposed to the chopper electrode 46, and on the inner side of the chopper electrode 46, a measuring electrode 48 is disposed on a printed substrate 47 at a position opposed to the chopper electrode 46. The printed substrate 47 is positively fixed by two screws 49 so as to come into intimate contact with the inner side surface of the bent portion 37a of the base 37, and said electrode 48 is provided on the chopper electrode side at a position opposed to the chopper electrode 46. The shield member 38 is fixed to the two bent portions 37a and 37b of the base 37 by two screws 50. The bent portions 37a and 37b are bent so as to be entirely flush with each other, and the shield member 38 is fixed to the base 37 by the screws 50 so as to be in contact with the bent outer surface of the base 37.

That is, the stop hole of the shield member 38 is in the form of a slot extending widthwisely of the shield member 38 and, as previously described, it can bring the bent inner side surface of the shield member 38 into intimate contact with the bent outer side surface of the base 37. Accordingly, the shield member 38, like the tuning fork 40, is also in a conductive state with the base 37.

As described above, in the surface potentiometer of the present embodiment, the shield member having the measuring window 39 opposed to the measured portion of the photosensitive medium and the printed substrate 47 having the measuring electrode 48 are respectively fixed to the opposite surfaces of a plate-like member constituting the base 37 of the potentiometer and further, the chopper electrode 46 is provided in the central portion of the plate thickness of the base 37. That is, the shield member and the member having the measuring electrode are respectively mounted on the opposite surfaces of the plate-like member, whereby a surface potentiometer of very compact and simple construction may be provided.

The surface potentiometer 30 of the above-described construction is used near the drum 7 and in an atmosphere in which developing liquid exists and therefore, it is necessary to prevent the entry of the developing liquid into the surface potentiometer. That is, by inadvertently leaving the cleaning blade 29 urged against the photosensitive medium, the developing liquid drops onto the charger 10, the discharger 11, etc. and enters into the interior of the surface potentiometer 30 opening toward the drum side and further comes into the space of about 0.7 mm between the chopper electrode 46 and the measuring electrode 48. It solidifies therein to stop vibration of the chopper electrode or adheres to the measuring electrode 48 to cause charges to be accumulated thereon and greatly slow down the measuring speed.

Figure 9:
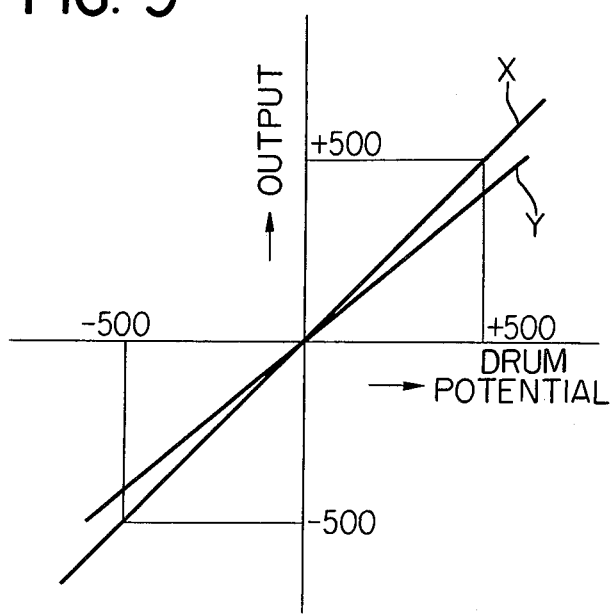
FIG. 9 is a graph of drum potential-measurement output characteristic illustrating the infuence of ground potential.

On the other hand, the above-described surface potentiometer is a feedback control type surface potentiometer in which the surface potential of the drum 7 opposed to the measuring window 39 is fed back to the shield member 38 and the chopper electrode 46, but the base 37 is at the ground potential reaching the body of the copying apparatus and therefore, an electric line of force based on the ground potential may enter into the measuring electrode 48 through the measuring window 39 and a hole (not shown) for mounting therethrough the printed substrate 47 to create a ground error resulting from the ground potential as shown in FIG. 9. That is, in FIG. 9, the solid line X shows the relation between the measurement output in the case of zero error free of the influence of the ground potential and the drum potential, but when the influence of the ground potential occurs, the measurement output is undesirably reduced as indicated by a thick solid line Y in FIG. 9.

Figure 10:
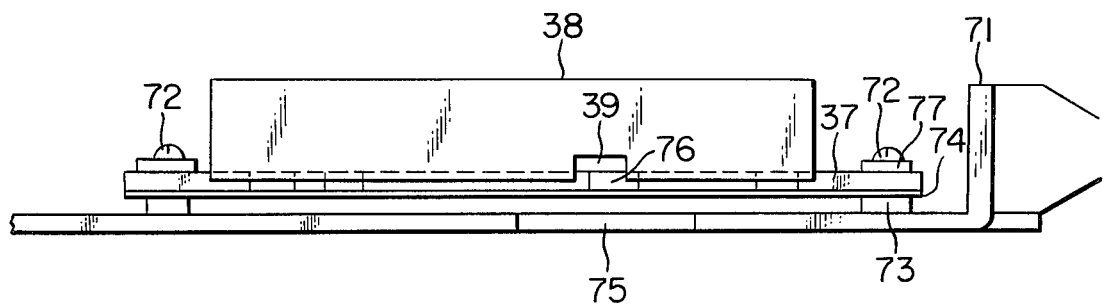
FIG. 10 is a front view of a surface potentiometer.
Figure 11:
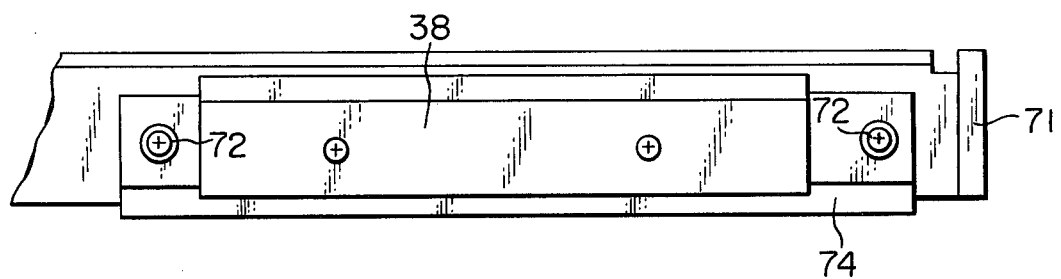
FIG. 11 is a plan view of the FIG. 10 surface potentiometer.
Figure 12:
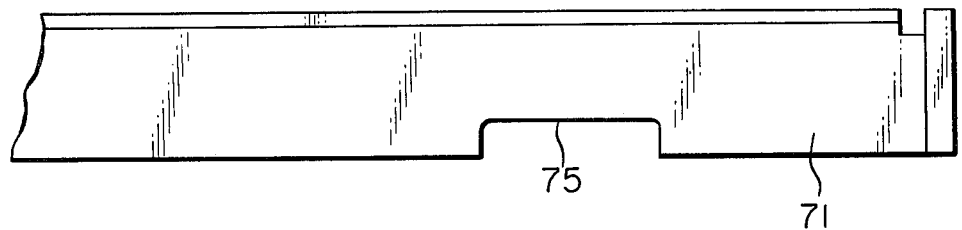
FIG. 12 is a plan view of a support plate 71.

Therefore, the present invention adopts a construction in which a shield plate 74 facing above the measuring window 39 is provided in the neighborhood of a support plate 71 supporting the potentiometer which corresponds to the measuring window is cut away. This is apparent from FIGS. 5-7, but will further be described by reference to FIGS. 10-12. In FIGS. 10-12, parts identical to those of FIGS. 5-7 are given identical reference characters.

In the present embodiment, a base mounting screw 72 for attaching the surface potentiometer to the support plate is utilized to attach the shield plate 74. That is, the base 37 is attached to the support plate 71 by the screw 72, and by this screw 72, the shield plate 74 formed of stainless steel to a thickness of the order of 0.3 mm is mounted between the base 37 and an insulating washer 73 to which the base 37 is attached, the end of the shield plate being disposed so as to be projected about 1.5 to about 2 mm from the end of the measuring window 39 toward the drum 7 as shown in FIG. 7. Accordingly, the upper side of the measuring window is covered with this shield plate 74 so that the developing liquid dropping from the charger 10 side can be prevented from entering into the interior of the surface potentiometer.

Also, as is apparent from FIGS. 10 and 12, a cut-away 75 is provided at the end edge of the support plate 71 and near the measuring window 39 to keep the ground potential away from the measuring window of the sensor and also shield the electric line of force resulting from the ground potential by the shield plate 74.

Also, as shown in FIG. 10, a cut-away portion 76 for mounting the printed substrate 47 is formed in the base 37, but any liquid leakage from this cut-away portion 76 and any measurement error can be prevented simply by providing the shield plate 74.

As is apparent from the foregoing description, according to the present invention, a construction is adopted in which a shield plate facing above the measuring window of the surface potentiometer is provided and a cut-away portion is formed in that portion of the surface potentiometer mounting support plate which is opposed to the measuring window and therefore, there may be obtained a surface potentiometer in which entry of the developing liquid into the interior of the surface potentiometer can be prevented by a very simple construction and occurrence of any measurement error resulting from the ground potential can be prevented.

Figure 13:
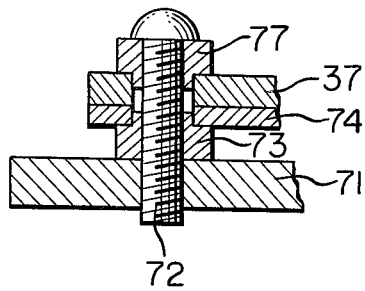
FIG. 13 is a cross-sectional view of a portion in which a base 37 and the support plate 71 are joined together.
Figure 14:
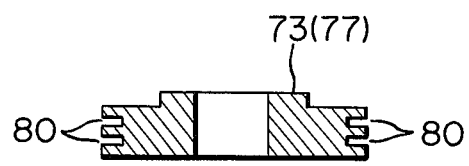
FIG. 14 is a cross-sectional view of a washer 73.

The potentiometer of the present embodiment adopts a negative feedback type potentiometer, as shown in FIG. 4. In such potentiometer, a completely insulated condition must be maintained among the lead wire of feedback voltage, the base 37 and shield plates 38, 74 having the feedback voltage applied thereto and the support plate 71 of the potentiometer having the ground voltage. In the present invention, to achieve such purpose, a construction is adopted in which the lead wire 78 connected to the potentiometer is covered with an insulative tube 79 and also is fixed by an insulating screw 72 with a spacer of insulative material interposed between the support plate 71 and the potentiometer. FIGS. 13 and 14 show such an embodiment. In FIGS. 13 and 14, parts corresponding to those shown in FIGS. 5 to 7 are given similar reference numerals. As shown in FIG. 13, the base 37 and the shield plate 74 are held between insulative washers 73 and 77 and fixed to the support plate 71 by means of an insulative screw 72 formed of synthetic resin. As shown in FIG. 14, each of the washers 73 and 77 has a plurality of grooves 80 formed in the entire circumference thereof to prevent any leak from the surface thereof. Also, as shown in FIGS. 5 and 7, the lead wire 78 for supplying a current to the potentiometer is covered with an insulative tube 79.

Figure 15:
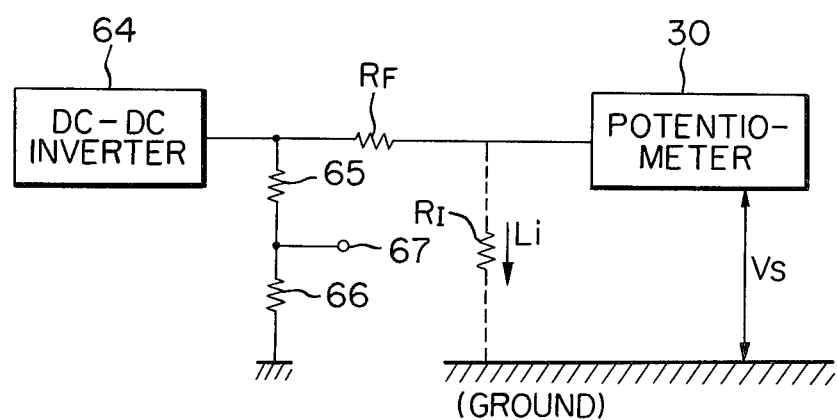
FIG. 15 is a diagram of a feedback circuit.

The reason why such construction has been adopted is that, as shown in FIG. 15, a feedback resistor $R_F$ interposed between the DC-DC inverter 64 and the surface potentiometer 30 is required to have as high a resistance as possible so that a person, having touched the surface potentiometer 30, does not feel a shock. The surface potential of the drum 7 becomes equal to the potential $V_S$ of the surface potentiometer and thus, the potential appearing at the measurement output terminal includes an error $R_X \times i_L$ ($i_L$ is the leak current of the surface potentiometer). The rate of the error to the potential $V_S$ of the surface potentiometer is $R_F/R_I$ ($R_I$ is the imaginary insulation resistor of the surface potentiometer) and actually, 5 MΩ is chosen as the resistance value of $R_F$ and assuming that the error is 1%, the resistance value of the insulation resistor $R_I$ of the surface potentiometer is required to be 500 MΩ and thus, the usual insulation countermeasure would make the realization difficult. Particularly, in the case of high temperature and high humidity, for example, temperature 35° C. and humidity 95%, it would be difficult to satisfy the insulation resistance of 500 MΩ due to the deteriorated insulation resulting from the water absorption of the insulating member and the leakage from the surface of the insulating member between a conductive portion and another conductive portion. However, since the above-described construction has been adopted, the portion having the feedback voltage applied thereto and the portion having the ground voltage are maintained in a completely insulated condition.

Figure 16:
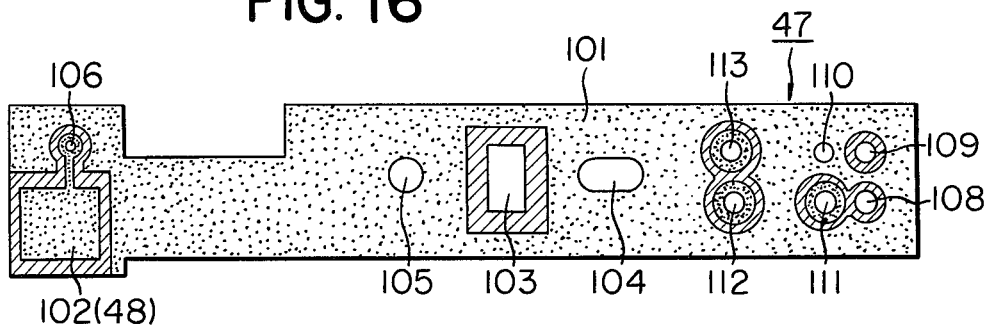
FIG. 16 is a plan view of that side of a printed substrate 47 which is adjacent to a measuring electrode.
Figure 17:
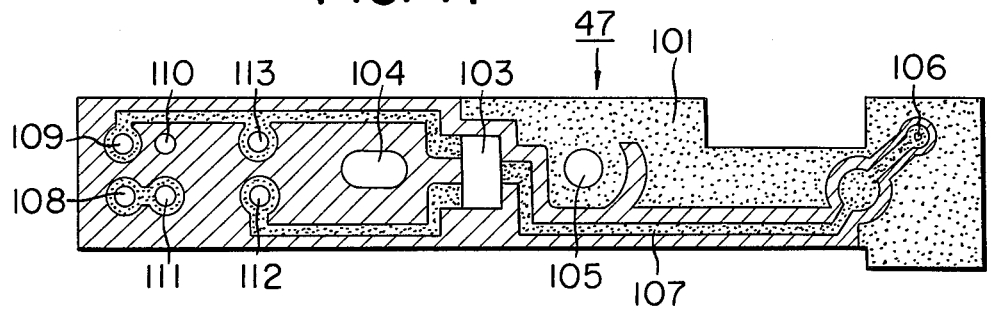
FIG. 17 is a plan view of that side of the printed substrate 47 which mounts the circuit parts.

The construction of the printed substrate 49 will hereinafter be described in detail. Referring to FIG. 16 which shows the wiring pattern on the measuring electrode side of the printed substrate 47, reference numeral 101 designates an earth side pattern having the feedback voltage supplied thereto and occupying most of the electrode side pattern. An electrode pattern 102 corresponding to the measuring electrode 48 is formed in a portion of the electrode side pattern. FIG. 17 shows the wiring pattern on the part mounting side which is the opposite side of the printed substrate 47. The portions indicated by hatching in FIGS. 16 and 17 are the portions from which a metal such as copper has been removed by etching, and the white portions are through-holes. Reference numeral 103 designates a through-hole in which the FET 52 (FIG. 3) may be embedded, and reference numerals 104 and 105 denote through-holes for screwing the printed substrate 47 to the bent portion 37a of the base plate 37 (FIG. 5). The metal electrode around a through-hole 108 is connected to a Vcc power source for driving the FET 52, and a measurement signal is taken out from the metal electrode around a through-hole 109. The resistor 53 (FIG. 3) is connected between the electrode around a through-hole 111 and the electrode around a through-hole 112, and the resistor 54 is connected between the electrode around a through-hole 110 and the electrode around a through-hole 113. Also, a through-hole 106 is a rivet hole for transmitting a signal induced on the measuring electrode pattern 102 to an electrode wiring pattern 107 on the opposite side, and a rivet member is inserted and caulked in the rivet hole 106.

In the present embodiment constructed as described above, the measuring electrode is integral with the printed substrate, and the connection to the preamplifier circuit input formed on the printed substrate is made through the through-hole and conductive pattern of the printed substrate and thus, the necessity of wiring work is entirely eliminated. Accordingly, the construction of the surface potentiometer becomes very simple and further, the earth pattern 101 formed on both sides of the printed substrate can be utilized as a shield electrode and therefore, even the very close area of the measuring electrode can be simply shielded. Accordingly, the amount of superposition of the drive signal provided by vibration of the chopper electrode upon the potential signal can be reduced.

Description will now be made of a second embodiment of the printed substrate 47. The present embodiment adopts a construction in which a flexible substrate is adhesively secured onto a hard substrate which constitutes the printed substrate. FIGS. 18–24 illustrate such embodiment.

Figure 18:
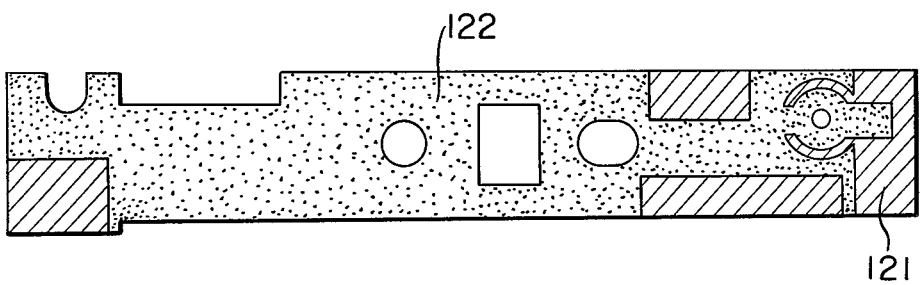
FIG. 18 is a plan view of that side of a hard substrate 121 which is adjacent to the measuring electrode.
Figure 19:
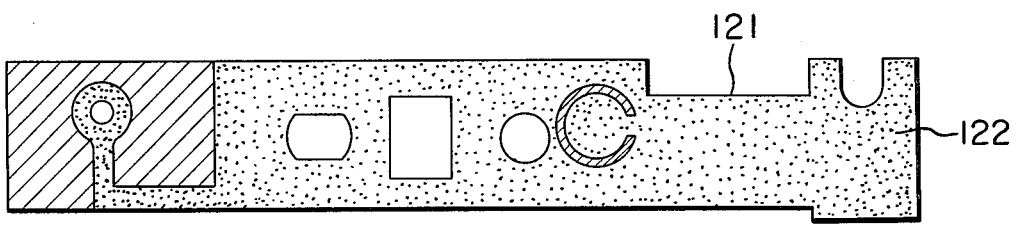
FIG. 19 is a plan view of that side of the hard substrate 121 which mounts the circuit parts.

FIGS. 18 and 19 illustrate a hard substrate 121. FIG. 18 shows the wiring pattern on the measuring electrode side, and FIG. 19 shows the wiring pattern on the part mounting side. In these Figures, the portions indicated by hatching are portions having no copper foil attached thereto, and reference numeral 122 designates a conductive portion having a copper foil attached thereto. White portions are through-holes.

The hard substrate 121 is formed by laminating glass fiber such as epoxy resin and a shielding conductive pattern 122 is formed on the opposite side surfaces thereof.

Figure 20:
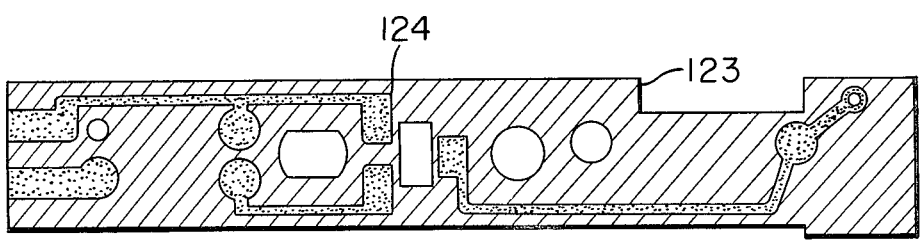
FIG. 20 is a plan view of a flexible printed plate.

A flexible printed substrate 123 shown in FIG. 20 is adhesively secured to the surface which provides the part mounting side of this hard substrate 121.

Figure 21:
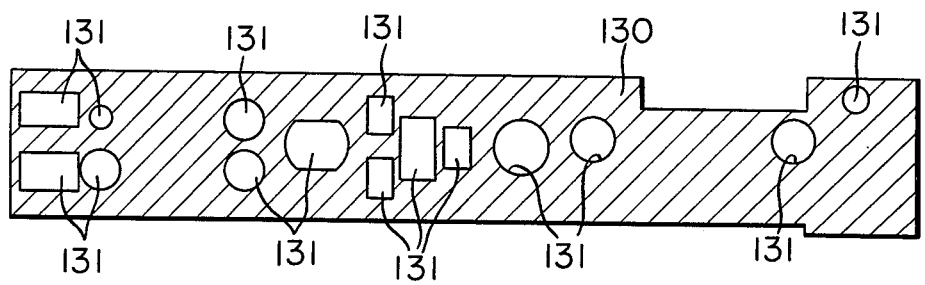
FIG. 21 is a plan view of a cover lay.

The flexible printed substrate 123 is formed of polyimide resin or the like and on the surface thereof, there is formed a conductive pattern 124 comprising a copper foil having a predetermined pattern. A cover lay 130 as shown in FIG. 21 is further attached to the upper surface of the flexible printed substrate 123. This cover lay 130 is also formed of insulative resin such as polyimide resin or the like and shaped into a flexible sheet-like form, and the portion thereof which requires soldering or the portion thereof in which through-holes or the like must be formed is formed with a predetermined number of opening portions 131 corresponding to the respective shapes. Thus, the conductive pattern 124 of the flexible printed substrate 123 is sandwiched between the flexible substrate of polyimide resin or the like and the cover lay, and the portion thereof other than the necessary portion is completely covered and insulated.

Figure 22:
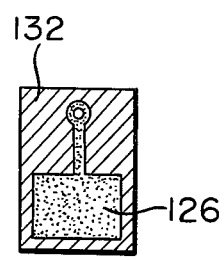
FIG. 22 is a plan view of a flexible printed plate attached to the measuring electrode portion.
Figure 23:
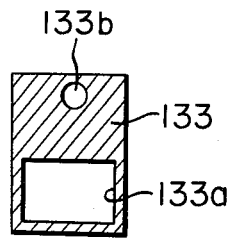
FIG. 23 is a plan view of a cover lay.

FIG. 22 shows a flexible printed substrate 132 adhesively secured to the measuring electrode 48 side. The flexible printed substrate 132, like the flexible printed substrate 123 of FIG. 20, is formed of polyimide resin or the like and on the surface thereof, there is formed a conductive pattern 126 corresponding to the measuring electrode 48. A cover lay 133 as shown in FIG. 23 is further attached to the flexible printed substrate 132. This cover lay 133 is also formed of polyimide resin or the like, and an opening portion 133a is formed in the portion thereof in which the conductive pattern 126 constituting the measuring electrode 48 is exposed, and an opening 133b is also formed to transmit the detection signal induced in the conductive pattern 126 to the back side (the part mounting side).

Figure 24:
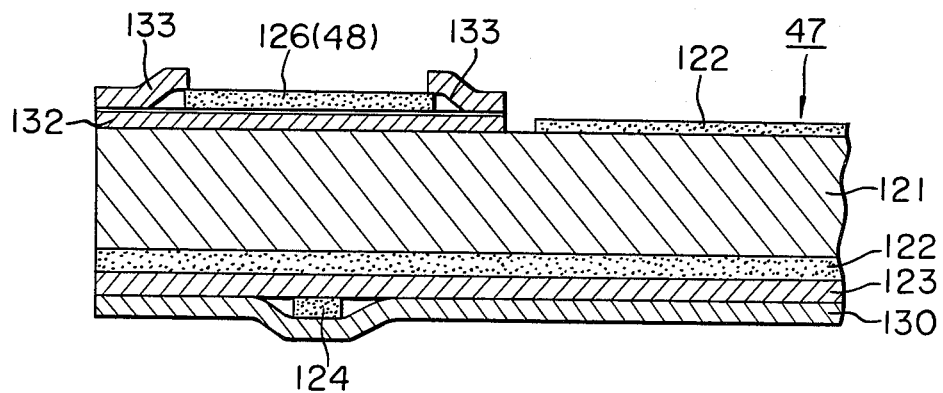
FIG. 24 is a partial enlarged cross-sectional view of the printed substrate 47 according to a second embodiment.

FIG. 24 shows an enlarged cross-sectional view of the printed substrate of a portion of the measuring electrode 48. In this manner, the other conductive pattern than the measuring electrode portion and the soldered portion assumes a sandwich structure completely sealed by a cover lay formed of the same material as the base formed of polyimide resin, and can realize a complete water-proof and humidity-proof structure.

The present embodiment which has the above-described construction can achieve the intended purposes such as water-proofing and humidity-proofing and in addition, since the flexible printed substrate is simply secured to the hard substrate by means of an adhesive agent or the like, the heretofore required cumbersome procedures of providing a masking over a required portion, and then applying resin for humidity-proofing, and thereafter stripping off the masking become entirely unnecessary. The hard substrate serves both as a support plate for the flexible printed substrate and as a shield electrode, but in the portion to which the base 132 which is a flexible substrate formed with the measuring electrode 48 is adhesively secured, no copper foil is formed on the hard substrate and thus, the attenuation of the potential signal based on the distribution amount of the flexible substrate is prevented. In the present embodiment, polyimide resin is used for the base of the flexible substrate, whereas use may also be made of other material such as Teflon, polyethylene, polystyrene, nylon, polyvinyl chloride or polyester.

A third embodiment of the printed substrate 47 will hereinafter be described. In the second embodiment, an insulative cover lay is attached to the portion other than the measuring electrode and the soldered portion, but the third embodiment adopts a construction in which the portion other than the measuring electrode and the soldered portion is molded by the use of thermoplastic synthetic resin.

Figure 25:
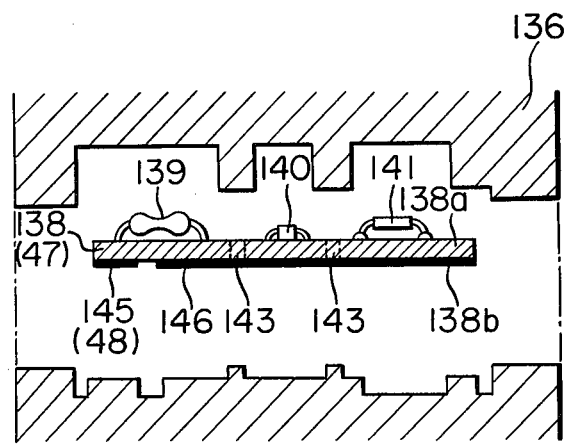
FIG. 25 illustrates a method of making the printed substrate according to a third embodiment.
Figure 26:
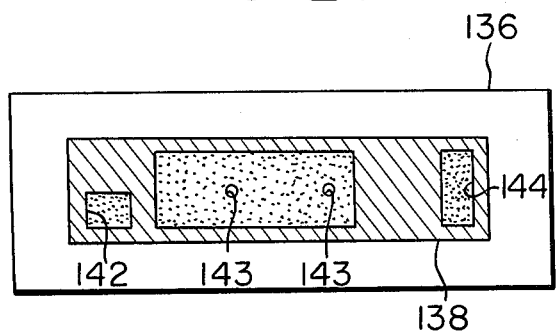
FIG. 26 is a plan view of the printed substrate according to the third embodiment.

Referring to FIGS. 25 and 26 which illustrate an embodiment of the present invention, reference numeral 136 designates an upper metal mold and reference numeral 137 denotes a lower metal mold. These constitute female and male metal mold cavities. Designated by 138 is the aforementioned printed substrate (47), and on one side surface 138a thereof, a conductive pattern to which electronic parts 139–141 are attached is formed by a copper foil or the like. On the other side surface 138b of the printed substrate 138, a copper foil 145 constituting the measuring electrode 48 and a copper foil 146 constituting a shield electrode are formed by etching.

The female and male metal molds, as is well-known, accomplishes a desired molding by injecting synthetic resin or the like into their metal mold cavities formed by the combination thereof, and they are of such a construction that by the utilization of the cavities of the female and male metal molds, a space is formed or blocked so that a portion corresponding to the electronic parts 139–141 mounted on the printed substrate 138, or to the measuring electrode 48, or to the through-hole may or may not permit pouring of synthetic resin.

When injection molding is effected with respect to the printed substrate 138 by using such upper and lower metal molds 136 and 137, there is obtained the molded printed substrate 138 as shown in FIG. 26. FIG. 26 shows the measuring electrode side. In FIG. 26, the portion indicated by hatching is the portion molded by synthetic resin. In FIG. 26, reference numeral 142 designates an opening portion for the measuring electrode, and reference numeral 143 denotes a threaded hole for attaching the printed substrate 138 to the bent portion 37a of the base 37 of FIG. 5. Designated by 144 is an opening portion for soldering.

Since the present embodiment is constructed as described above, most of the conductive pattern comprising a copper foil or the like formed on the surface of the printed substrate 138 is molded by insulative synthetic resin and thus, the humidity-influenced leak phenomenon between the conductive patterns formed on the printed substrate as previously described can be prevented.

A fourth embodiment of the printed substrate 47 will now be described. As the second embodiment of the printed substrate 47, a construction has been shown herein in which the circuit pattern is constituted by a flexible printed plate and it is attached to a hard substrate of glass epoxy serving both as a shield electrode and a support. The second embodiment is excellent in humidity-proof property, but the volume resistivity of the flexible printed substrate is great. For example, in the case of polyimide resin, the volume resistivity is $10^{12}$–$10^{18}$ Ω·cm. Due to its great volume resistivity, the flexible printed substrate is ready to be charged and therefore, it catches the charges in the air and creates a measurement error. Further, the flexible printed substrate is small in dimensions and therefore, it may be deviated when attached to a hard substrate, and also may peel off after being attached. The fourth embodiment eliminates these disadvantages.

Figure 27:
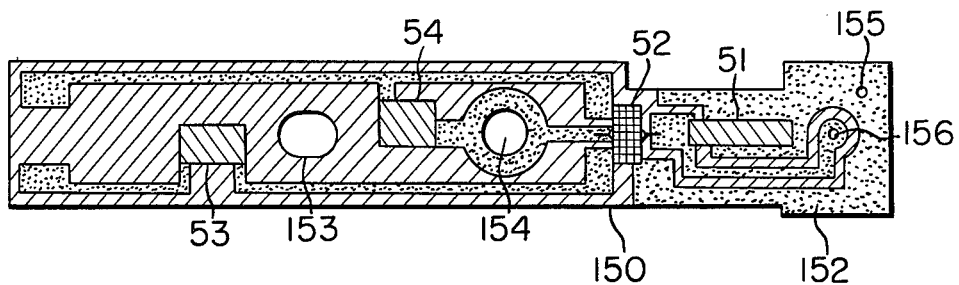
FIG. 27 is a plan view of that side of the printed substrate according to a fourth embodiment which is adjacent to the preamplifier circuit.
Figure 28:
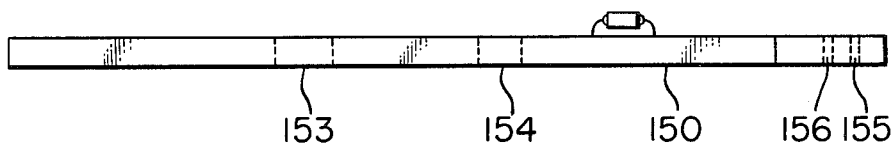
FIG. 28 is a front view of the FIG. 27 printed substrate.
Figure 29:
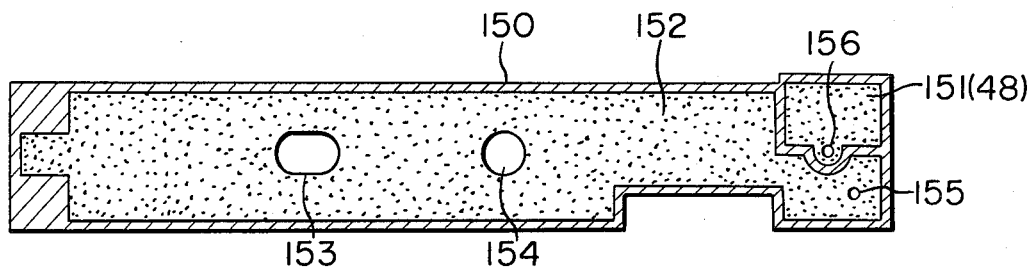
FIG. 29 is a plan view of that side of the printed substrate according to the fourth embodiment which is adjacent to the measuring electrode.

FIGS. 27–29 show the fourth embodiment. In the present embodiment, a ceramic substrate 150 is used as the printed substrate 47 constituting a preamplifier circuit comprising the measuring electrode 48 and the resistors 51, 53, 54 and FET 52 shown in FIG. 3.

Figure 30:
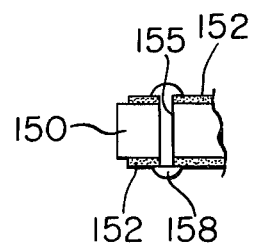
FIG. 30 is a cross-sectional view for illustrating a method of connecting the front and back surfaces of the printed substrate.

FIG. 27 shows the surface of the ceramic substrate 150 which mounts the parts of the preamplifier circuit, and FIG. 29 shows the surface thereof which has the measuring electrode 48. The printed copper foil pattern of the measuring electrode 48 is designated at 151. This measuring electrode pattern 151 is in proximity to and encircled by a likewise printed shield electrode pattern 152 and eliminates the driving signal of the chopper electrode 46. Also, the resistors 51, 53 and 54 of FIG. 3 are printed by using a printing resistor of metal glaze. Further, the FET 52 is tentatively attached by cream solder, and then brazed by the use of a hot plate. Designated by 153 and 154 are mounting apertures for mounting the ceramic substrate to the bent portion 37a (FIG. 5) of the base, and denoted by 155 and 156 are through-holes for communicating the front and back surface patterns with each other. The connection between the front and the back surface of the ceramic substrate 150 is made by inserting and caulking a rivet 158 in the through-hole 155(156), as shown in FIG. 30.

Since the volume resistivity of ceramics is $10^{12}$–$10^{14}$ Ω·cm, it is stable at low values in a narrow range as compared with the volume resistivity $10^{12}$–$10^{18}$ Ω·cm of polyester or polyimide used in the conventional flexible substrate. Accordingly, the flexible substrate of the present invention is not liable to be charged and can provide a measurement value having a small measurement error.

Particularly, a high degree of insulation is required between the measuring electrode 151 and the shield electrode 152, and the generation of friction charges in this portion and the adherence thereto of the dust in the air would seriously adversely affect the accuracy of measurement. But, since the volume resistivity of ceramics is low and stable, the ceramics in this portion is not charged and can maintain a high degree of insulation. Further, ceramics have excellent dust-proof properties as well as particularly, in a case where the ceramics is constructed by feedback system as in the present embodiment, a high voltage can be applied to the shield electrode 152 even if temperature increases.

Further, in the present embodiment, the resistors are printed as metal glaze resistors and the FET is fixed by cream solder and soldered in a furnace and therefore, the number of subsequent attachment steps of the circuit parts is reduced and the circuit itself becomes stable and in addition, the production cost can be greatly reduced. Further, in the present embodiment, there is only one printed layer on the ceramic substrate, and this leads to the possibility of compactness and also leads to an effect that subsequent stage circuits such as a voltage amplifier and an output adjuster can be incorporated.

In the present invention, the measuring electrode, preamplifier circuit, shield electrode, etc. are formed on the ceramic substrate by printing, but of course they may also be formed by evaporation.

While some embodiments of the present invention have been described hitherto, the present invention is not restricted to the above-described embodiments, but various applications are modifications may be made within the scope as defined by the appended claims.

What we claim is:

1. A surface potentiometer comprising:
   a measuring electrode;
   a chopper for intermittently shielding the electric field between said measuring electrode and an object to be measured, wherein an AC signal is induced in said measuring electrode;
   a preamplifier circuit for amplifying the AC signal induced in said measuring electrode; and
   a printed substrate having the wiring pattern of said preamplifier circuit formed on one surface thereof and the electrode pattern of said measuring electrode formed on the other surface thereof.

2. A surface potentiometer according to claim 1, wherein said printed substrate comprises a ceramic substrate.

3. A surface potentiometer according to claim 1, wherein an electrically conductive pattern for shielding an electric field is provided in proximity to said electrode pattern on said other surface of said printed substrate.

4. A surface potentiometer according to claim 1, wherein the portion of said printed substrate except said electrode pattern portion and the soldered portion is covered with an insulating material.

5. A surface potentiometer according to claim 1, wherein the portion of said printed substrate except said electrode pattern portion and the soldered portion is molded by synthetic resin.

6. A surface potentiometer according to claim 2, wherein a resistor constituting said preamplifier circuit is printed on said ceramic substrate.

7. A surface potentiometer according to claim 1, wherein said printed substrate has a through-hole for transmitting the AC signal induced in said measuring electrode to said preamplifier circuit, and a rivet is driven into said through-hole.

8. A surface potentiometer according to claim 1, wherein said chopper effects reciprocal movement.

9. A surface potentiometer comprising:
   a measuring electrode;
   a chopper for intermittently shielding the electric field between said measuring electrode and an object to be measured;
   a preamplifier circuit for converting an AC signal induced in said measuring electrode into a low impedance signal;
   a first flexible printed plate having the electrode pattern of said measuring electrode formed thereon;
   a second flexible printed plate having the wiring pattern of said preamplifier circuit formed thereon;
   a hard substrate having said first and second flexible plates attached to the opposite surfaces thereof;
   a first insulating sheet attached to said first flexible printed plate and having an opening in a portion thereof opposed to said electrode pattern; and
   a second insulating sheet attached to said second flexible printed plate and having an opening in a portion thereof opposed to the soldered portion of said wiring pattern.

* * * * *

UNITED STATES PATENT AND TRADEMARK OFFICE
CERTIFICATE OF CORRECTION

PATENT NO. : 4,470,009

DATED : September 4, 1984

INVENTOR(S) : YOSHIAKI TAKAYANAGI, ET AL.

It is certified that error appears in the above-identified patent and that said Letters Patent is hereby corrected as shown below:

COLUMN 5

Line 43, "vibratory" should read --vibrator--.

COLUMN 11

Line 56, delete "as well as particularly" and insert --and--.

Line 57, "is constructed by" should read --structure includes a--.

COLUMN 12

Line 10, "are" should read --and--.

Signed and Sealed this

Sixteenth Day of July 1985

[SEAL]

Attest:

DONALD J. QUIGG

Attesting Officer    Acting Commissioner of Patents and Trademarks